(12) United States Patent
Ham et al.

(10) Patent No.: US 11,076,488 B2
(45) Date of Patent: Jul. 27, 2021

(54) BOARD HAVING ELECTRONIC COMPONENT EMBEDDED THEREIN

(71) Applicant: SAMSUNG ELECTRO-MECHANICS CO., LTD., Suwon-si (KR)

(72) Inventors: Ho Hyung Ham, Suwon-si (KR); Jae Sung Sim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 80 days.

(21) Appl. No.: 16/681,110

(22) Filed: Nov. 12, 2019

(65) Prior Publication Data

US 2021/0068259 A1  Mar. 4, 2021

(30) Foreign Application Priority Data

Aug. 29, 2019  (KR) .......................... 10-2019-0106881

(51) Int. Cl.
*H05K 1/18* (2006.01)
*H05K 1/03* (2006.01)
*H01L 23/00* (2006.01)

(52) U.S. Cl.
CPC ............ *H05K 1/183* (2013.01); *H01L 24/05* (2013.01); *H05K 1/0306* (2013.01); *H01L 2224/02331* (2013.01); *H01L 2224/02372* (2013.01); *H05K 2201/09036* (2013.01)

(58) Field of Classification Search
CPC ................ H05K 1/183; H05K 1/0306; H05K 2201/09036; H01L 24/05; H01L 2224/02372; H01L 2224/02331
See application file for complete search history.

(56) References Cited

U.S. PATENT DOCUMENTS

| | | | |
|---|---|---|---|
| 6,154,366 A * | 11/2000 | Ma ...................... | H01L 23/5389 257/700 |
| 10,939,556 B1 * | 3/2021 | Sim ...................... | H01L 23/5386 |
| 2004/0014317 A1 * | 1/2004 | Sakamoto .......... | H01L 23/49838 438/689 |
| 2011/0291293 A1 * | 12/2011 | Tuominen ........... | H01L 23/5389 257/774 |
| 2015/0235994 A1 * | 8/2015 | Ohba ...................... | H01L 24/97 257/676 |
| 2015/0262841 A1 * | 9/2015 | Kim ........................ | H01L 24/85 438/107 |

(Continued)

FOREIGN PATENT DOCUMENTS

| | | |
|---|---|---|
| EP | 1139705 B1 | 11/2006 |
| KR | 10-0916697 B1 | 9/2009 |

(Continued)

*Primary Examiner* — Yuriy Semenenko
(74) *Attorney, Agent, or Firm* — Morgan, Lewis & Bockius LLP

(57) ABSTRACT

A board having an electronic component embedded therein, includes a core layer having a groove with a bottom surface, an electronic component disposed above the bottom surface of the groove and spaced apart from the bottom surface of the groove, and an insulating layer disposed on the core layer and covering at least a portion of the electronic component. The insulating layer is disposed in at least a portion of a space between the bottom surface of the groove and the electronic component.

20 Claims, 11 Drawing Sheets

(56) References Cited

U.S. PATENT DOCUMENTS

2016/0066428 A1* 3/2016 Tago .................... H05K 1/0298
                                                                361/764
2018/0315674 A1* 11/2018 Chen ................... H01L 23/3128

FOREIGN PATENT DOCUMENTS

| KR | 10-1084526 B1 | 11/2011 |
| KR | 10-1384035 B1 | 4/2014 |

* cited by examiner

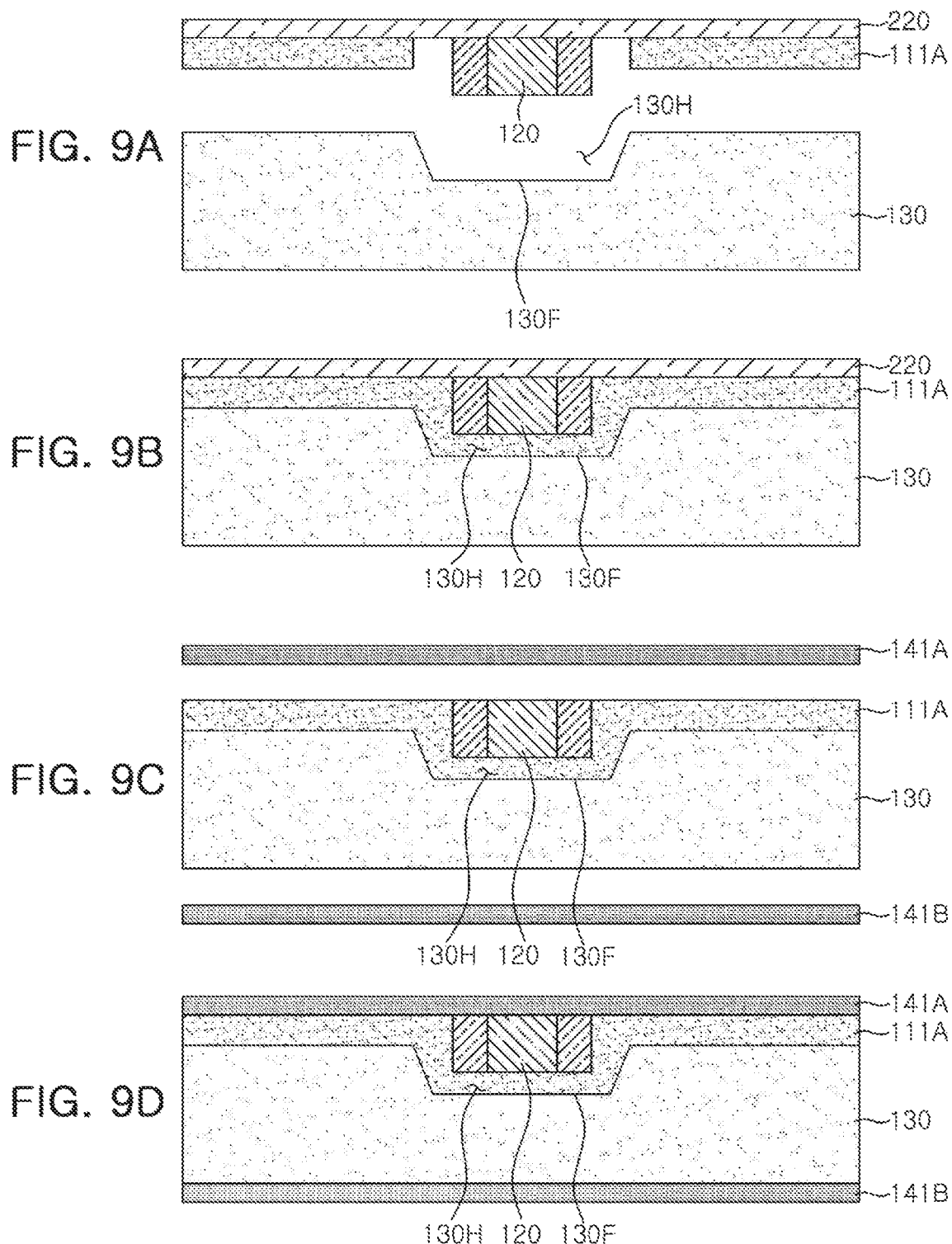

BOARD HAVING ELECTRONIC COMPONENT EMBEDDED THEREIN

CROSS-REFERENCE TO RELATED APPLICATION(S)

This application claims the benefit under 35 USC 119 (a) of Korean Patent Application No. 10-2019-0106881 filed on Aug. 29, 2019 in the Korean Intellectual Property Office, the entire disclosure of which is incorporated herein by reference for all purposes.

TECHNICAL FIELD

The present disclosure relates to a board having an electronic component embedded therein.

BACKGROUND

Recently, portable electronic devices such as mobile phones and tablet PCs have been required to have high performance while being miniaturized and thinned. Accordingly, a technology for a board having an electronic component embedded therein, in which electronic components such as passive elements and active elements are embedded in a printed circuit board, is under development.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a board having an electronic component embedded therein, in which the possibility of the occurrence of warpage may be reduced.

An aspect of the present disclosure is to provide aboard having an electronic component embedded therein, manufactured in a simplified process.

According to an aspect of the present disclosure, a board having an electronic component embedded therein, includes a core layer having a groove with a bottom surface, an electronic component disposed above the bottom surface of the groove and spaced apart from the bottom surface of the groove, and an insulating layer disposed on the core layer and covering at least a portion of the electronic component. The insulating layer is disposed in at least a portion of a space between the bottom surface of the groove and the electronic component.

BRIEF DESCRIPTION OF DRAWINGS

The above and other aspects, features, and advantages of the present disclosure will be more clearly understood from the following detailed description, taken in conjunction with the accompanying drawings, in which:

FIGS. 7A to 9D schematically illustrate portions of a process of manufacturing a board having an electronic component embedded therein according to an example.

DETAILED DESCRIPTION

Figure 1:
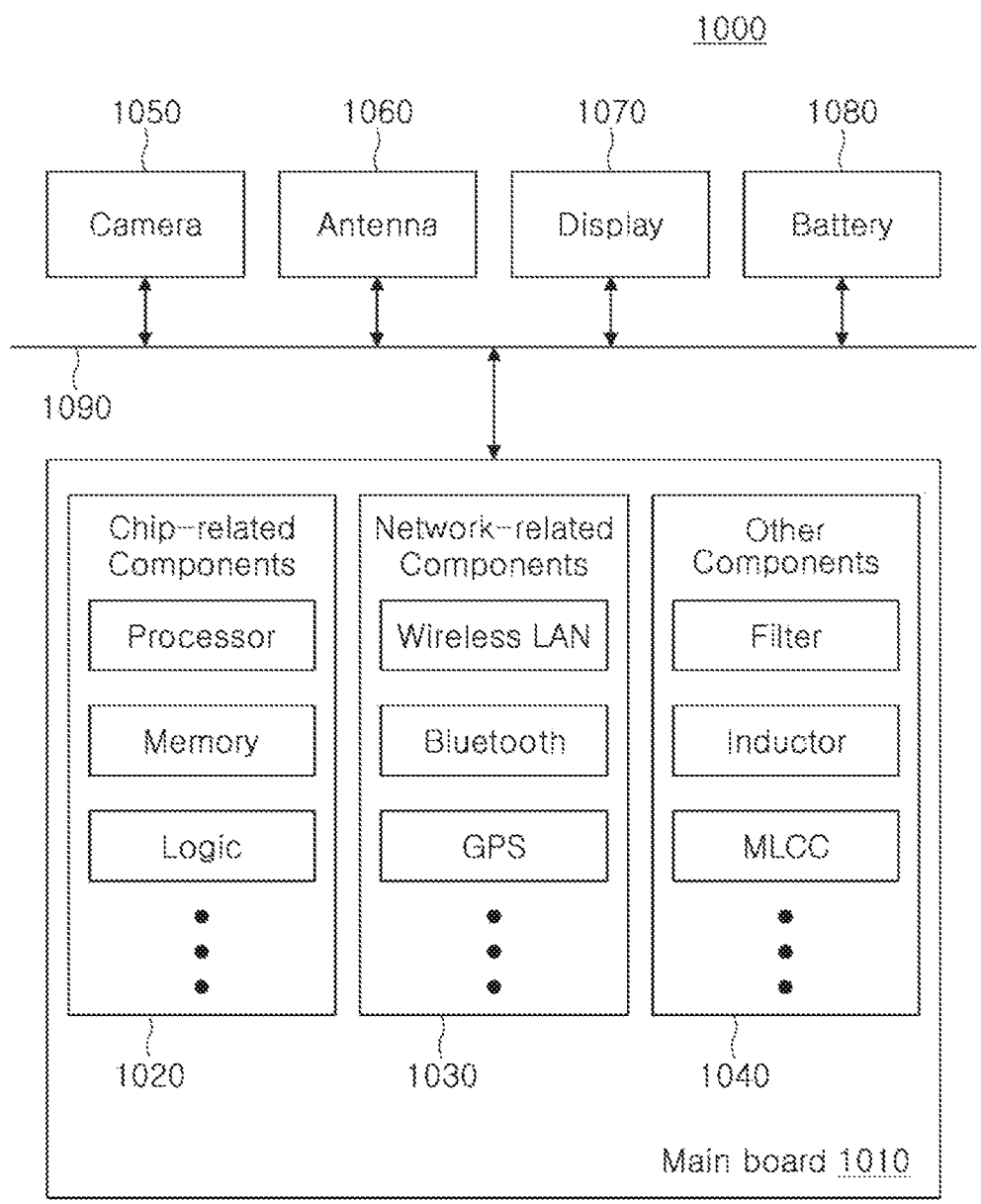
FIG. 1 is a schematic block diagram of an electronic device system according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in m other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Electronic Device

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other. The chip related components 1020 may be in the form of a package including the above-described chips or electronic components.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030.

Depending on a type of the electronic device 1000, the electronic device 1000 may include other electronic components that may or may not be physically and/or electrically connected to the main board 1010. These other electronic components may include, for example, a camera module 1050, an antenna module 1060, a display 1070, a battery 1080, or the like. However, these other electronic components are not limited thereto, but may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, these other electronic components may also include other electronic components used for various purposes depending on a type of electronic device, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
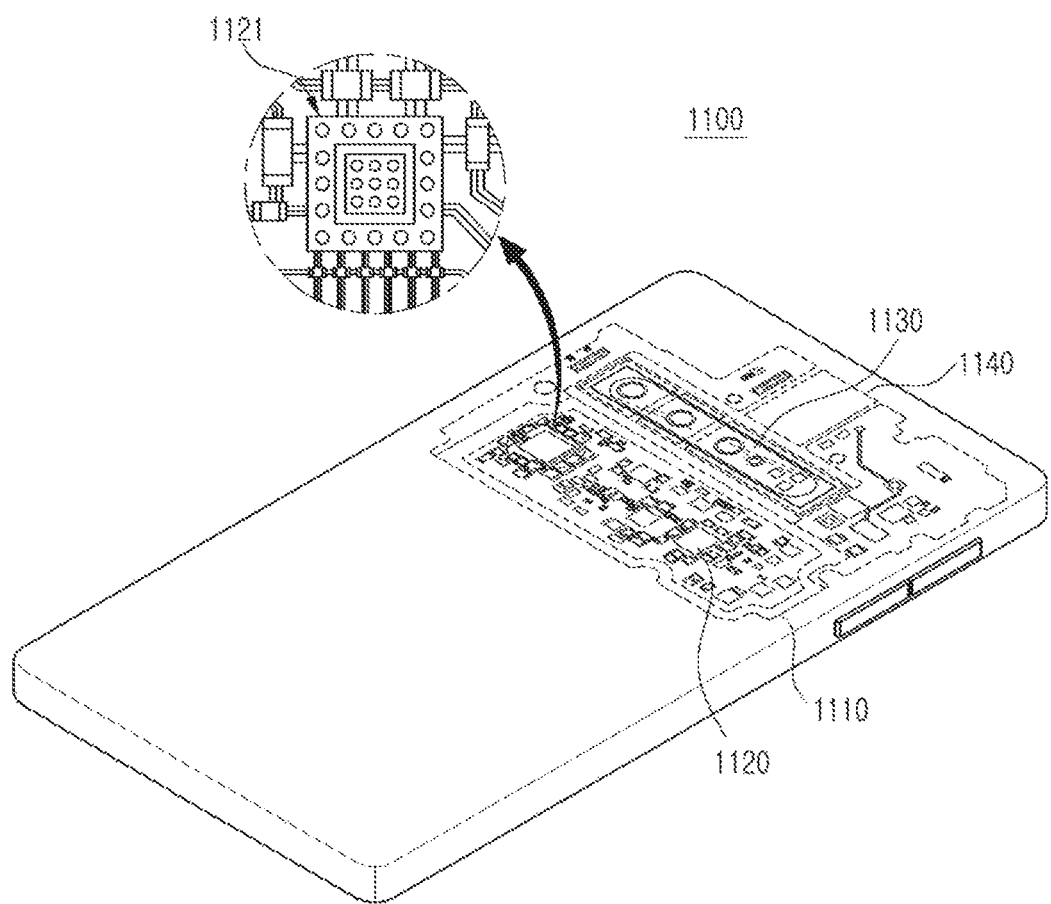
FIG. 2 schematically illustrates a perspective view of an electronic device according to an example.

FIG. 2 is a schematic perspective view illustrating an example of an electronic device.

Referring to FIG. 2, the electronic device may be, for example, a smartphone 1100. A motherboard 1110 is accommodated in the smartphone 1100, and various electronic components 1120 are physically and/or electrically connected to the motherboard 1110. In addition, other electronic components, such as a camera module 1130 and/or a speaker 1140, which may or may not be physically and/or electrically connected to the motherboard 1110, may be accommodated in the smartphone 1100. A portion of the electronic components 1120 may be the above-described chip-related component, and for example, may be a semiconductor package 1121, but is not limited thereto. The semiconductor package 1121 may be a surface mounted type such as a semiconductor chip or a passive component on a package substrate having a multilayer electronic component embedded substrate, but an example thereof is not limited thereto. The electronic device is not necessarily limited to the smartphone 1100, and may be another electronic device.

Board Having Electronic Component Embedded Therein

Figure 3A:
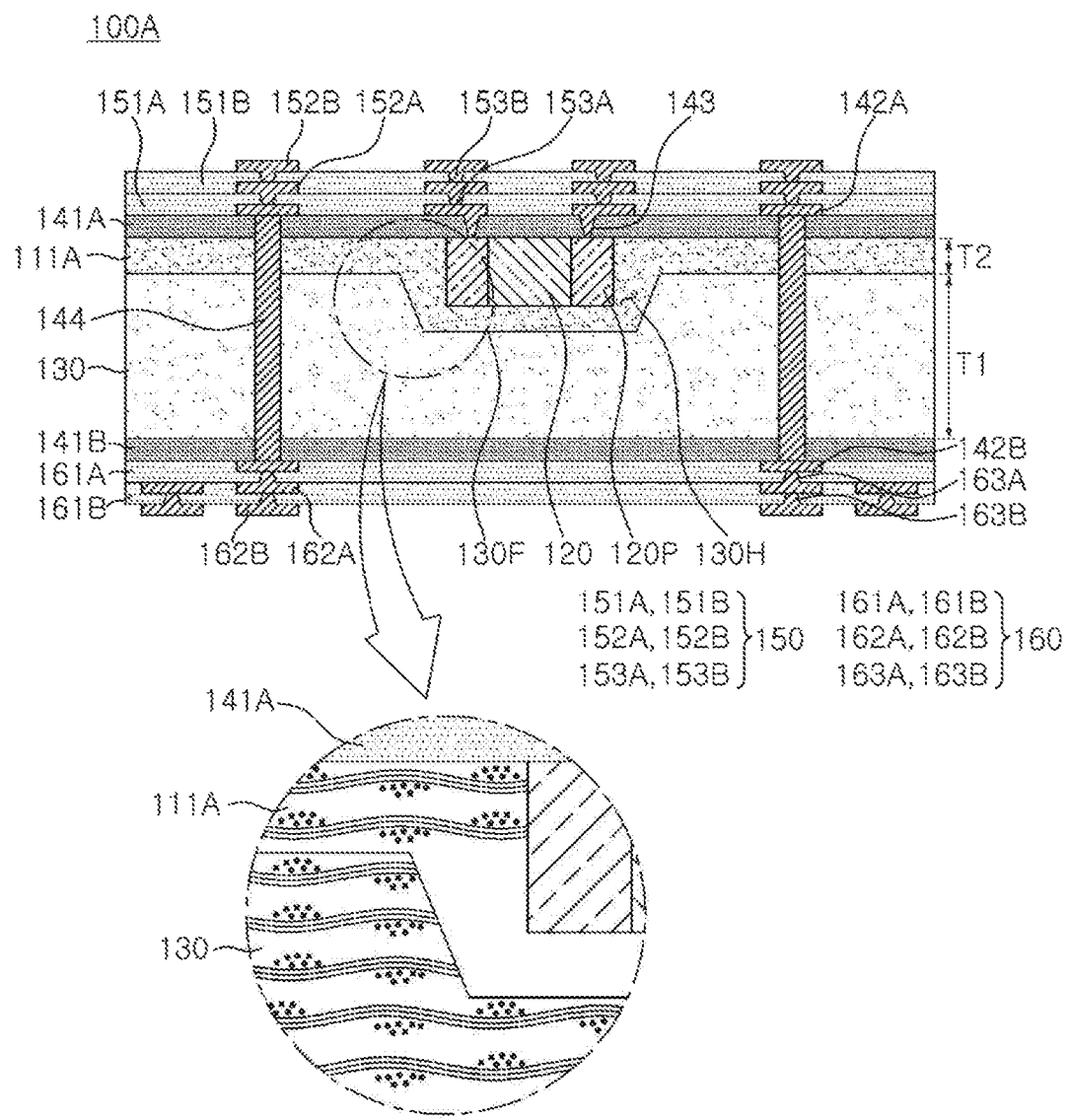
FIGS. 3A and 3B are a schematic cross-sectional view of a board having an electronic component embedded therein according to an example.
Figure 3B:
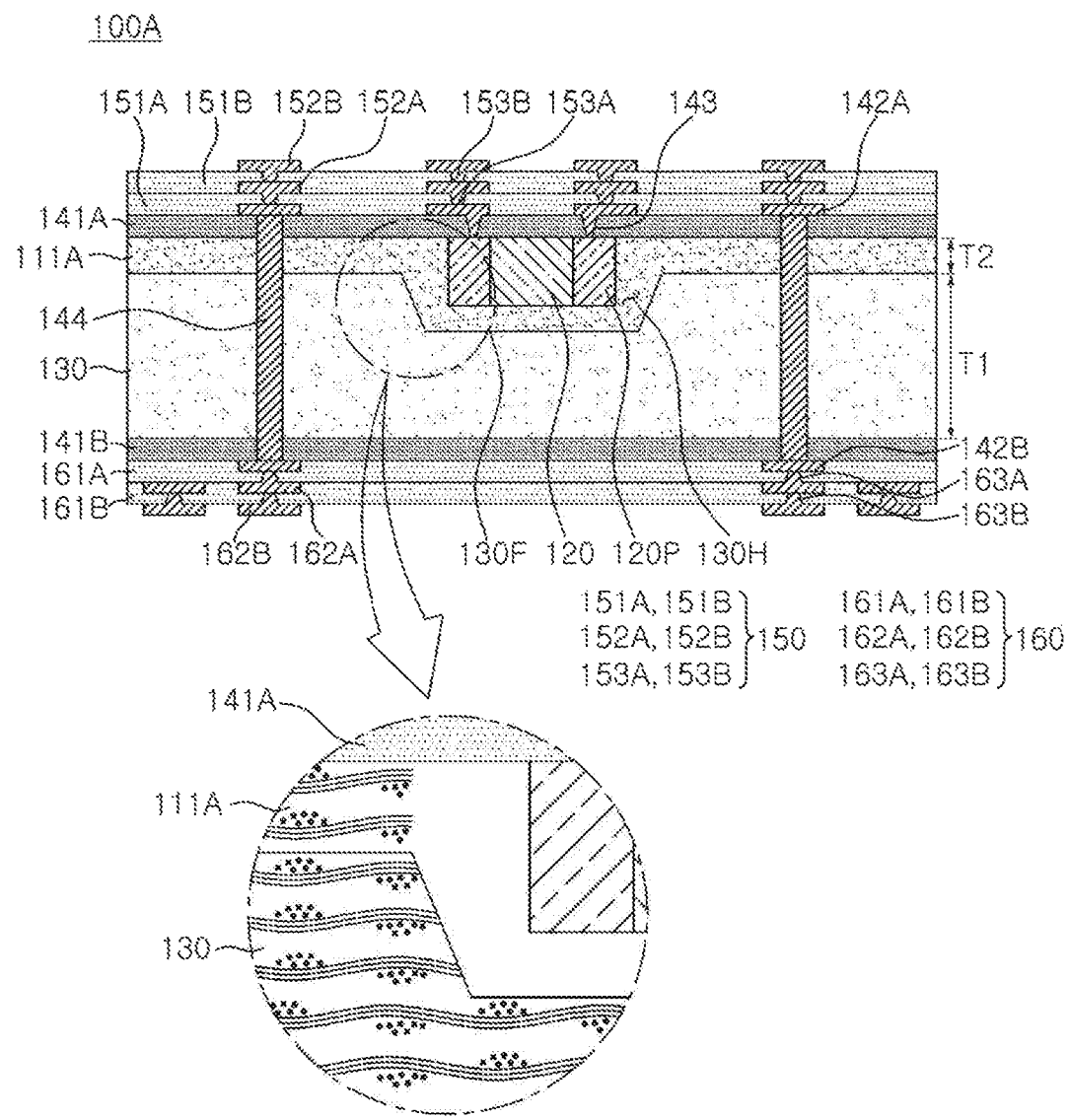

FIGS. 3A and 3B are a schematic cross-sectional view of a board 100A having an electronic component embedded therein according to an example.

Referring to FIGS. 3A and 3B, the board 100A having an electronic component embedded therein according to an example includes a core layer 130 having a groove 130H, an electronic component 120 disposed above a bottom surface 130F of the groove 130H to be spaced apart from the bottom surface 130F of the groove 130H, a first insulating layer 111A disposed on one surface of the core layer 130 in which the groove 130H is formed, and covering at least a portion of the electronic component 120, a second insulating layer 141A disposed on the first insulating layer 111A, a first wiring layer 142A disposed on the first insulating layer 111A, a first connection member 150 disposed on the second insulating layer 141A and the first wiring layer 142A, a third insulating layer 141B disposed on the other surface of the core layer 130, opposing to the one surface of the core layer 130 in which the groove 130H is formed, a second wiring layer 142B disposed on the third insulating layer 141B, a second connection member 160 disposed on the third insulating layer 141B and the second wiring layer 142B, a via 143 penetrating through the second insulating layer 141A and connecting the electronic component 120 and the first wiring layer 142A to each other, and a through-via 144 penetrating through the first insulating layer 111A, the core layer 130, the second insulating layer 141A and the third insulating layer 141B, and connecting the first wiring layer 142A and the second wiring layer 142B to each other.

The first insulating layer 111A fills at least a portion of the groove 130H. In detail, the first insulating layer 111A fills a space between the electronic component 120 and the bottom surface 130F of the groove 130H. Accordingly, the electronic component 120 is disposed above the bottom surface 130F of the groove 130H, to be spaced apart from the bottom surface 130F of the groove 130H by a predetermined distance by the first insulating layer 111A. Therefore, the electronic component 120 and the bottom surface 130F of the groove 130H do not contact each other.

At least a portion of the electronic component 120 may be disposed in at least a portion of the groove 130H. For example, an interface between the first insulating layer 111A and the core layer 130 contacting each other, in the vicinity of the groove 130H, may be disposed at a level between upper and lower surfaces of the electronic component 120.

One surface of the electronic component 120 may be exposed to one surface of the first insulating layer 111A. Since a space between the electronic component 120 and the bottom surface 130F of the groove 130H is filled with the first insulating layer 111A, a surface of the electronic component 120 opposing a surface of the electronic component 120 facing the bottom surface 130F of the groove 130H may be exposed to one surface of the first insulating layer 111A. In this case, the surface of the electronic component 120 facing the bottom surface 130F of the groove 130H, and one surface of the first insulating layer 111A, may be substantially coplanarized. The term 'coplanarable' in this specification means not only to form perfectly coplanar surfaces, but also to form substantially coplanar surfaces in consideration of manufacturing process errors.

As illustrated in 3A and 3B, a thickness T1 of the core layer 130 around the groove 130H may be greater than a thickness T2 of the first insulating layer 111A around the groove 130H.

Hereinafter, respective configurations of the board 100A having an electronic component embedded therein according to an example will be described in more detail.

A material of the first insulating layer 111A is not particularly limited, and any material may be used as long as it has insulating properties. For example, a thermosetting resin such as an epoxy resin, a thermoplastic resin such as polyimide, or a resin in which these resins further contain a reinforcing material such as an inorganic filler and/or glass cloth (or glass fabric) or the like, for example, prepreg, Ajinomoto Build-up Film (ABF), FR-4, Bismaleimide Triazine (BT) or the like may be used. Photo Imageable Dielectric (PID) resins may also be used as required.

In this case, referring to the partially enlarged view, when the material of the first insulating layer 111A includes a reinforcing material such as an inorganic filler and/or glass fiber, the reinforcing material may not fill the groove 130H depending on a process to be described later. Therefore, only the first insulating layer 111A disposed in an area other than the groove 130H may include a reinforcing material, and the first insulating layer 111A in the groove 130H may only include a resin excluding the reinforcing material such as an inorganic filler and glass fiber. Therefore, the reinforcing material may be disposed between one surface of the first insulating layer 111A, which is a surface thereof in which the first insulating layer 111A is in contact with the core layer 130 around the groove 130H, and the opposite surface of the surface.

The electronic component 120 may be a passive component such as a multilayer ceramic capacitor (MLCC), a power inductor (PI) or the like, and may be an active component such as an integrated circuit (IC) die. The electronic component 120 may include an electrode pad or an electrode unit 120P.

A material of the core layer 130 is not particularly limited, and any material may be used as long as the material has insulation properties. For example, a thermosetting resin such as an epoxy resin, a thermoplastic resin such as polyimide, or a resin in which these resins further contain a reinforcing material such as an inorganic filler and/or glass cloth (or glass fabric) or the like, for example, prepreg, Ajinomoto Build-up Film (ABF), FR-4, Bismaleimide Triazine (BT) or the like may be used. A Photo Imageable Dielectric (PID) resin may also be used as required.

The first insulating layer 111A and the core layer 130 may be formed of the same material. For example, the first insulating layer 111A and the core layer 130 may be formed of a single material. In this case, thermal behavior and characteristics of a single material undergoing a thermal process may be predicted, and thus, advantageous properties in which the possibility of the occurrence of warpage is reduced may be obtained compared to the case of using a composite material.

The shape of the groove 130H is not particularly limited. For example, the groove 130H may have a quadrangular pillar shape, a quadrangular pillar shape having an inclined side, a cylindrical shape, a cylindrical shape having an inclined side, but the shape of the groove 130H is not limited thereto.

The groove 130H may have the bottom surface 130F. In this specification, the bottom surface 130F does not necessarily mean a flat surface, but is meant to include an inclined or curved surface. The bottom surface 130F may be a portion that is substantially deepest in the groove 130H. However, in the case in which the bottom surface 130F is inclined or curved, a depth of the bottom surface 130F in the groove 130H may not be the same for each measurement point.

Respective materials of the second and third insulating layers 141A and 141B are not particularly limited, and any material may be used as long as the material has insulation properties. For example, a thermosetting resin such as an epoxy resin, a thermoplastic resin such as polyimide, or a resin in which these resins further contain a reinforcing material such as an inorganic filler and/or glass cloth (or glass fabric) or the like, for example, prepreg, Ajinomoto Build-up Film (ABF), FR-4, Bismaleimide Triazine (BT) or the like may be used. A Photo Imageable Dielectric (PID) resin may also be used as required The second and third insulating layers 141A and 141B may include the same material as that of the first insulating layer 111A and/or the core layer 130.

As a material of each of the first and second wiring layers 142A and 142B, a conductive material such as copper (Cu), aluminum (Al), silver (Ag), tin (Sn), gold (Au), nickel (Ni), lead (Pb), titanium (Ti), or alloys thereof may be used. The first wiring layer 142A and the second wiring layer and 142B may perform various functions depending on the design. For example, examples of the design may include a ground (GrouND: GND) pattern, a power (PoWeR: PWR) pattern, a signal (S) pattern, and the like. In this case, the signal S pattern includes various signals except for the ground GND pattern, the power PWR pattern and the like, for example, includes a data signal and the like. In addition, the signal S pattern includes a via pad or the like.

A material for formation of the via 143 may be a conductive material such as copper (Cu), aluminum (Al), silver (Ag), tin (Sn), gold (Au), nickel (Ni), lead (Pb), titanium (Ti), alloys thereof or the like. The via 143 may be entirely filled with a conductive material, or the conductive material may be formed along a wall of the via. The shape of the via 143 may be any shape known in the art, such as a tapered shape, a cylindrical shape or the like.

A material of a through-via 144 may also be a conductive material such as copper (Cu), aluminum (Al), silver (Ag), tin (Sn), gold (Au), nickel (Ni), lead (Pb), titanium (Ti), or alloys thereof. The through-via 144 may be completely filled with a conductive material, or may be formed as the conductive material is formed along a wall of a via. In a case in which the through-via 144 is formed as a conductive material is formed along the wall of the via, the inside of the wall of the via may be filled with an insulating material or the like. In addition, the shape of the through-via 144 may be any shape known in the art, such as a tapered shape, a cylindrical shape or the like.

The first connection member 150 includes a first insulating layer 151A, a first redistribution layer 152A disposed on the first insulating layer 151A, a first via 153A penetrating through the first insulating layer 151A and connecting the first wiring layer 142A and the first redistribution layer 152A, a second insulating layer 151B disposed on the first insulating layer 151A and covering the first redistribution layer 152A, a second redistribution layer 152B disposed on the second insulating layer 151B, and a second via 153B penetrating through the second insulating layer 151B and connecting the first redistribution layer 152A and the second redistribution layer 152B.

However, an example of the present disclosure is not limited thereto and may be variously modified by those skilled in the art. For example, the number of insulating layers, redistribution layers, and vias included in the first connection member 150 may be more or less than that illustrated in the drawings.

The material of the respective first and second insulating layers 151A and 151B is not particularly limited, and any material may be used as long as it has insulating properties. For example, a thermosetting resin such as an epoxy resin, a thermoplastic resin such as polyimide, or a resin in which these resins further contain a reinforcing material such as an inorganic filler and/or glass cloth (or glass fabric) or the like, for example, prepreg, Ajinomoto Build-up Film (ABF), FR-4, Bismaleimide Triazine (BT) or the like may be used. A Photo Imageable Dielectric (PID) resin may also be used as required.

A boundary between the first and second insulating layers 151A and 151B may not be distinguished depending on a material and a process of each insulating layer. For example, the first insulating layer 151A and the second insulating layer 151B are integrated with each other during a lamination process or the interface therebetween is unclear, and thus, it may be difficult to visually distinguish a boundary surface therebetween in a completed electronic component-embedded board structure.

The first and second redistribution layers 152A and 152B may be respectively formed of a conductive material such as copper (Cu), aluminum (Al), silver (Ag), tin (Sn), gold (Au), nickel (Ni), lead (Pb), titanium (Ti) or alloys thereof. The first and second redistribution layers 152A and 152B may perform various functions depending on the design. For example, examples of the design may include a ground (GrouND: GND) pattern, a power (PoWeR: PWR) pattern, a signal (S) pattern, and the like. In this case, the signal S pattern includes various signals except for the ground GND pattern, the power PWR pattern and the like, for example, includes a data signal and the like. In addition, the signal S pattern includes a via pad, a connection terminal pad, or the like.

The first and second vias 153A and 153B may be respectively formed of a conductive material such as copper (Cu), aluminum (Al), silver (Ag), tin (Sn), gold (Au), nickel (Ni), lead (Pb), titanium (Ti) or alloys thereof. The first and second vias 153A and 153B may be respectively, completely filled with a conductive material, or may be formed as the conductive material is formed along a wall of a via. The shape of each of the first and second vias 153A and 153B may be any shape known in the art, such as a tapered shape, a cylindrical shape or the like.

The second connection member 160 includes a first insulating layer 161A, a first redistribution layer 162A disposed on the first insulating layer 161A, a first via 163A penetrating through the first insulating layer 161A and connecting a second wiring layer 142B and the first redistribution layer 162A, a second insulating layer 161B disposed on the first insulating layer 161A and covering the first redistribution layer 162A, a second redistribution layer 162B disposed on the second insulating layer 161B, and a second via 163B penetrating through the second insulating layer 161B and connecting the first redistribution layer 162A and the second redistribution layer 162B.

However, the configuration of the second connection member 160 is not limited thereto, and may be variously modified according to examples. For example, the number of the insulating layers, the redistribution layers and the vias included in the second connection member 160 may be more or less than that illustrated in the drawings.

The material of each of the first and second insulating layers 161A and 161B is not particularly limited, and any material may be used as long as it has insulating properties. For example, a thermosetting resin such as an epoxy resin, a thermoplastic resin such as polyimide, or a resin in which these resins further contain a reinforcing material such as an inorganic filler and/or glass cloth (or glass fabric) or the like, for example, prepreg, Ajinomoto Build-up Film (ABF), FR-4, Bismaleimide Triazine (BT) or the like may be used. A Photo Imageable Dielectric (PID) resin may also be used as required.

A boundary between the first insulating layer 161A and the second insulating layer 161B may not be distinguished depending on a material and a process of each insulating layer. For example, the first insulating layer 161A and the second insulating layer 161B may be integrated with each other during a lamination process or the interface between the first insulating layer 161A and the second insulating layer 161B may be unclear, and thus, it may be difficult to visually distinguish a boundary surface therebetween in a completed electronic component-embedded board structure.

As a material of each of the first and second redistribution layers 162A and 162B, a conductive material such as copper (Cu), aluminum (Al), silver (Ag), tin (Sn), gold (Au), nickel (Ni), lead (Pb), titanium (Ti), or alloys thereof may be used. The first redistribution layer 162A and the second redistribution layer 162B may perform various functions depending on the design. For example, examples of the design may include aground (GrouND: GND) pattern, a power (PoWeR: PWR) pattern, a signal (S) pattern, and the like. In this case, the signal S pattern includes various signals except for the ground GND pattern, the power PWR pattern and the like, for example, includes a data signal and the like. In addition, the signal S pattern includes a via pad, a connection terminal pad, or the like.

As a material of each of the first and second vias 163A and 163B, a conductive material such as copper (Cu), aluminum (Al), silver (Ag), tin (Sn), gold (Au), nickel (Ni), lead (Pb), titanium (Ti), or alloys thereof may be used. The first and second vias 163A and 163B may be respectively, completely filled with a conductive material, or may be formed as the conductive material is formed along a wall of a via. The shape of each of the first and second vias 163A and 163B may be any shape known in the art, such as a tapered shape, a cylindrical shape or the like.

The number of insulating layers and/or wiring layers included in the first connection member 150 and the second connection member 160 may be the same. For example, the number of insulating layers and/or wiring layers formed on both surfaces of the core layer 130 and the first insulating layer 111A, for example, on both surfaces based on the core layer 130 and the first insulating layer 111A, may be the same. As such, the insulating layer and/or the wiring layer are built up in both sides in a symmetrical form, thereby obtaining an advantageous effect in terms of reduction in warpage.

Figure 4:
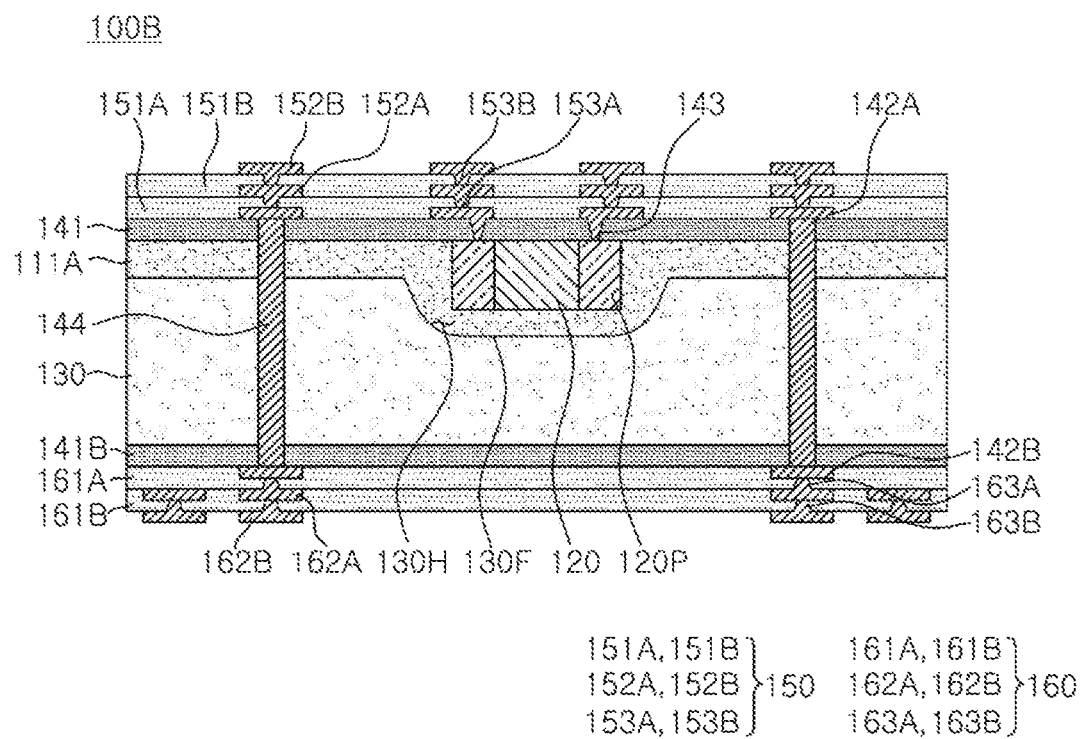
FIG. 4 is a schematic cross-sectional view of a board having an electronic component embedded therein according to another example.

FIG. 4 is a schematic cross-sectional view of a board 100B having an electronic component embedded therein according to another example.

Referring to FIG. 4, in the case of the board 100B having an electronic component embedded therein according to another example, an edge of a bottom surface 130F of a groove 130H has a rounded shape, as compared with the configuration of the board 100A having an electronic component embedded therein according to the above-described example.

As described above, when the edges of the bottom surface 130F of the groove 130H have a rounded shape, the first insulating layer 111A may be advantageous to fill the groove 130H in the process to be described later. In addition, the possibility of the occurrence of voids may be reduced. A detailed process thereof is mentioned later.

Other details are substantially the same as those described with respect to the board 100A having an electronic component embedded therein according to the example, and detailed descriptions thereof will be omitted.

Figure 5:
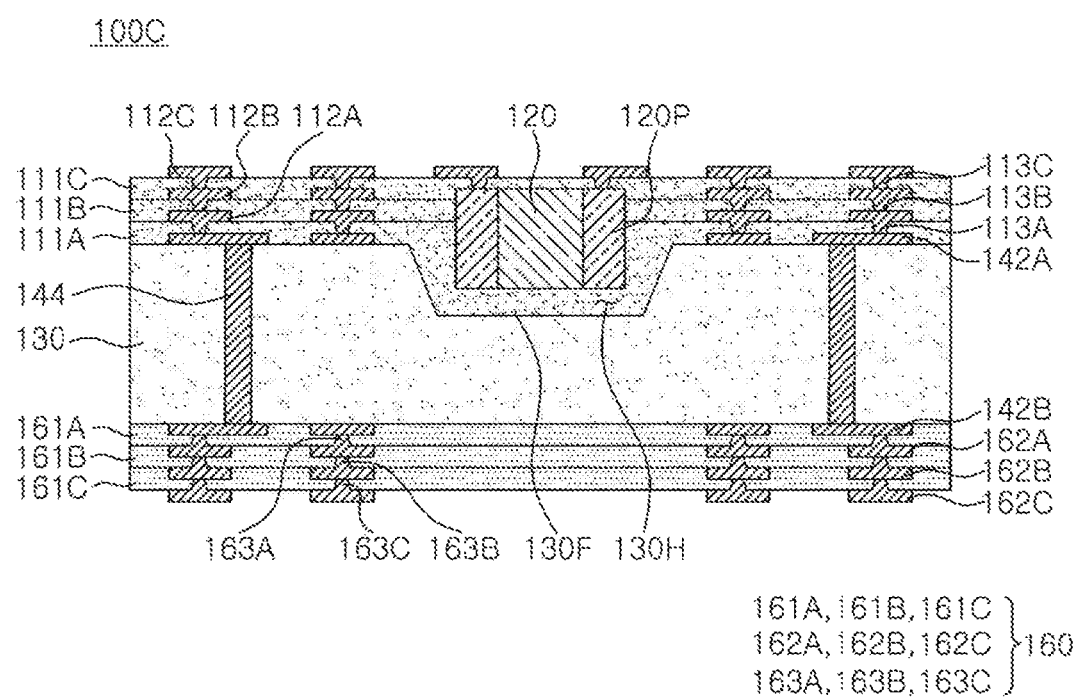
FIG. 5 is a schematic cross-sectional view of a board having an electronic component embedded therein according to another example.

FIG. 5 is a schematic cross-sectional view of a board 100C having an electronic component embedded therein according to another example.

Referring to FIG. 5, in the case of the board 100C having an electronic component embedded therein according to another example, one surface of an electronic component 120 protrudes upwardly from one surface of a first insulating layer 111A, as compared with the configuration of the board 100A having an electronic component embedded therein according to the example. In addition, a plurality of insulating layers 111B and 111C covering at least a portion of the electronic component 120 in addition to the first insulating layer 111A, a plurality of redistribution layers 112A, 112B and 112C, and a plurality of vias 113A and 113B and 113C may be further disposed in the board 100C having an electronic component embedded therein.

For example, the board 100C having an electronic component embedded therein according to the example may include a first redistribution layer 112A disposed on the first insulating layer 111A, a first via 113A penetrating through the first insulating layer 111A and connecting a first wiring layer 142A and the first redistribution layer 112A, a second insulating layer 111B disposed on the first insulating layer 111A and covering the first redistribution layer 112A, a second redistribution layer 112B disposed on the second insulating layer 111B, a second via 113B penetrating through the second insulating layer 111B and connecting the first redistribution layer 112A and the second redistribution layer 112B, a third insulating layer 111C disposed on the second insulating layer 111B and covering the second redistribution layer 112B, a third redistribution layer 112C disposed on the third insulating layer 111C, and a third via 113C penetrating through the third insulating layer 111C and connecting the second and third redistribution layers 112B and 112C to each other. The third via 113C may also connect the electronic component 120 and the third redistribution layer 112C.

However, the example of the present disclosure is not limited thereto and may be changed variously. For example, the number of the plurality of insulating layers, redistribution layers and vias disposed on the first insulating layer 111A or embedded in the first insulating layer 111A may be more or less than that illustrated in the drawings.

The first wiring layer 142A and a second wiring layer 142B may be disposed on both sides of a core layer 130, respectively, and a through-via 144 may penetrate through the core layer 130 to connect the first wiring layer 142A and the second wiring layer 142B.

Although not illustrated in the drawing, a second insulating layer (corresponding to the third insulating layer 141B in the board 100A having an electronic component embedded therein) disposed between the core layer 130 and a second connection member 160 may further be included in the board 100C as required, as in the board 100A having an electronic component embedded therein according to the example. In this case, the second wiring layer 142B may be disposed on the second insulating layer (corresponding to the third insulating layer 141B in the board 100A having an electronic component embedded therein), and the through-via 144 may further penetrate through the second insulating layer (corresponding to the third insulating layer 141B in the board 100A having an electronic component embedded therein.

A material of each of the first to third insulating layers 111A, 111B and 111C is not particularly limited, and any material may be used as long as the material has insulating properties. For example, a thermosetting resin such as an epoxy resin, a thermoplastic resin such as polyimide, or a resin in which these resins further contain a reinforcing material such as an inorganic filler and/or glass cloth (or glass fabric) or the like, for example, prepreg, Ajinomoto Build-up Film (ABF), FR-4, Bismaleimide Triazine (BT) or the like may be used. A Photo Imageable Dielectric (PID) resin may also be used as required.

Boundaries between the first to third insulating layers 111A, 111B and 111C may not be distinguished from each other depending on the material and the process of each insulating layers. For example, the first to third insulating layers 111A, 111B and 111C are integrated with each other during a lamination process or interfaces therebetween are unclear, and thus, it may be difficult to visually distinguish the boundary surfaces therebetween in a completed electronic component-embedded board structure.

As a material of each of the first to third redistribution layers 112A, 112B and 112C, a conductive material such as copper (Cu), aluminum (Al), silver (Ag), tin (Sn), gold (Au), nickel (Ni), lead (Pb), titanium (Ti), or alloys thereof may be used. The first to third redistribution layers 112A, 112B and 112C may perform various functions depending on the design. For example, examples of the design may include a ground (GrouND: GND) pattern, a power (PoWeR: PWR) pattern, a signal (S) pattern, and the like. In this case, the signal S pattern includes various signals except for the ground GND pattern, the power PWR pattern and the like, for example, includes a data signal and the like. In addition, the signal S pattern includes a via pad, a connection terminal, or the like.

As a material of each of the first to third vias 113A, 113B and 113C, a conductive material such as copper (Cu), aluminum (Al), silver (Ag), tin (Sn), gold (Au), nickel (Ni), lead (Pb), titanium (Ti) or alloys thereof may be used. The first to third vias 113A, 113B and 113C may be respectively, completely filled with a conductive material, or may be formed as the conductive material is formed along a wall of a via. The shape of each of the first to third vias 113A, 113B and 113C may be any shape known in the art, such as a tapered shape, a cylindrical shape or the like.

Other details are substantially the same as those described with respect to the board 100A having an electronic component embedded therein according to the example, and detailed descriptions thereof will be omitted.

Figure 6:
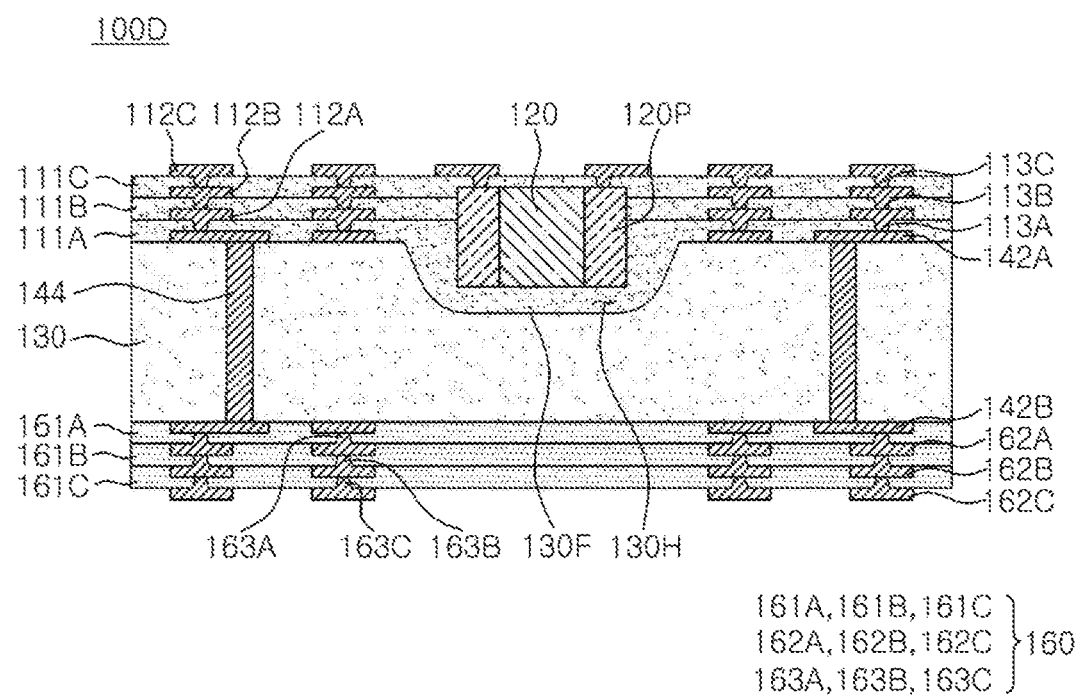
FIG. 6 is a schematic cross-sectional view of a board having an electronic component embedded therein according to another example.

FIG. 6 is a schematic cross-sectional view of a board 100D having an electronic component embedded therein according to another example.

Referring to FIG. 6, in the case of the board 100D having an electronic component embedded therein according to another example, an edge of a bottom surface 130F of a groove 130H has a rounded shape, as compared with the configuration of the board 100C having an electronic component embedded therein according to the above-described example.

As described above, when the edges of the bottom surface 130F of the groove 130H have a rounded shape, the first insulating layer 111A may be advantageous in that the first insulating layer 111A fills the groove 130H in a process to be described later. In addition, the possibility of the occurrence of voids may be reduced. A detailed process will be described later.

Other details are substantially the same as those described with respect to the boards 100A and 100C having an electronic component embedded therein according to the examples, and thus, detailed descriptions thereof will be omitted.

FIGS. 7A to 9D schematically illustrate a portion of a process of manufacturing the board 100A having an electronic component embedded therein according to an example.

Figure 7A:
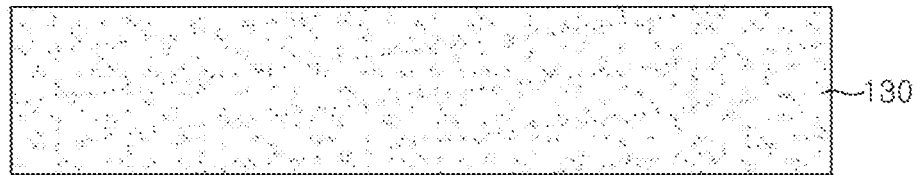
Figure 7B:
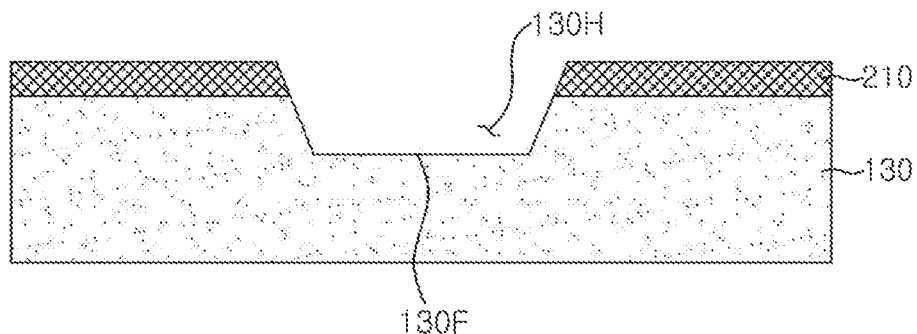
Figure 7C:
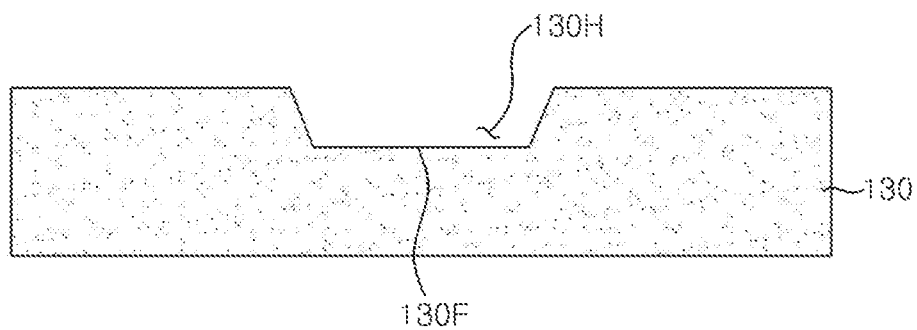

Referring to FIGS. 7A to 7C, first, a core member 130 is prepared, and then, a groove 130H is formed in the core member 130. The groove 130H may be formed by a sand-blasting method using abrasive particles, a dry etching method using plasma, or the like. However, an example of the present disclosure is not limited thereto, and the groove 130H may be formed by mechanical drilling and/or laser drilling. In the case in which the groove 130H is formed using mechanical drilling and/or laser drilling, desmear treatment such as a permanganate method or the like is performed to remove a resin smear in the groove 130H. If necessary, the process of manufacturing the board 100A may include a process of forming a mask 210 to cover the vicinity of a portion of the core member in which the groove 130H is to be formed, forming the groove 130H and removing the mask 210.

On the other hand, an edge of a bottom surface 130F of the groove 130H may have a rounded shape, not an angled structure illustrated in FIGS. 7A to 7C. As described above, when the edges of the bottom surface 130F of the groove 130H have a rounded shape, the material of the first insulating layer 111A may be facilitated to fill the groove 130H in the process to be described later. In addition, the possibility of the occurrence of voids may be reduced.

Figure 8A:
Figure 8B:
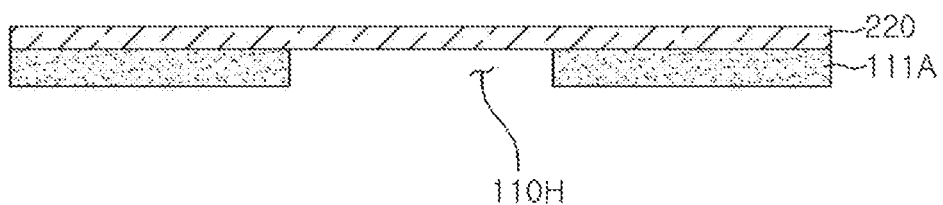
Figure 8C:
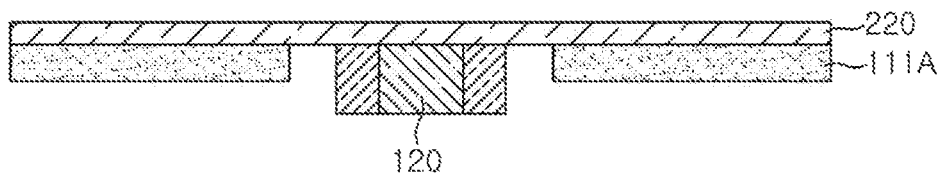

Referring to FIGS. 8A to 8C, after the first insulating layer 111A is prepared, a penetrating portion 110H is formed to penetrate through the first insulating layer 111A. The penetrating portion 110H may be formed by mechanical drilling and/or laser drilling. However, an example of the present disclosure is not limited thereto, and may be performed by a sandblasting method using abrasive particles, a dry etching method using plasma, or the like. In the case in which the penetrating portion 110H is formed using mechanical drilling and/or laser drilling, the desmear process, such as a permanganate method or the like, is performed to remove a resin smear in the penetrating portion 110H.

The material of the first insulating layer 111A may be in an uncured state or a semi-cured state. In this case, the material of the first insulating layer 111A in the uncured or semi-cured state flows into the penetrating portion 110H of the first insulating layer 111A and the groove 130H of the core layer 130, to fill the penetrating portion 110H and the groove 130H in a process to be described later. In this case, in a case in which the material of the first insulating layer 111A includes a reinforcing material such as an inorganic filler and/or glass fiber, the reinforcing material may not fill the groove 130H or not fill the penetrating portion 110H and the groove 130H. Therefore, only the first insulating layer 111A disposed in the region other than the groove 130H or in the region other than the penetrating portion 110H and the groove 130H includes the reinforcing material, and the first insulating layer 111A disposed in the groove 130H or the penetrating portion 110H and the groove 130H may include only a resin excluding the reinforcing material such as an inorganic filler and glass fiber. For example, the reinforcing material may be disposed between one surface of the first insulating layer 111A, which is a surface in which the first insulating layer 111A is in contact with the core layer 130 around the groove 130H, and the other surface thereof that is the opposite surface.

Next, an adhesive film 220 is attached to one side of the first insulating layer 111A. As the adhesive film 220, any one may be used as long as it can fix the first insulating layer 111A, any a known tape or the like may be used as one example without limitation. As an example of a well-known tape, a heat curable adhesive tape of which an adhesive force is weakened by heat processing, an ultraviolet curable adhesive tape of which an adhesive force is weakened by ultraviolet irradiation, or the like may be used.

Next, an electronic component 120 is disposed in the penetrating portion 110H of the first insulating layer 111A. For example, the electronic component 120 may be attached to the adhesive film 220 provided in the penetrating portion 110H. In this case, the electronic component 120 may be disposed to be spaced apart from the first insulating layer 111A by a predetermined distance in the penetrating portion 110H.

Referring to FIGS. 9A to 9D, the first insulating layer 111A in which the electronic component 120 is disposed, and the core layer 130 in which the groove 130H is formed, are laminated. As described above, the material of the first insulating layer 111A may be in an uncured state or a semi-cured state before lamination, and may be cured after lamination. Therefore, the material of the first insulating layer 111A may flow into the penetrating portion 110H and the groove 130H of the core layer 130 to fill the penetrating portion 110H and the groove 130H. In a case in which the material of the first insulating layer 111A includes a reinforcing material such as an inorganic filler and/or glass fiber, the reinforcing material may not fill the groove 130H or not fill the penetrating portion 110H and the groove 130H. Therefore, only the first insulating layer 111A disposed in the region other than the groove 130H or in the region other than the penetrating portion 110H and the groove 130H includes the reinforcing material, and the first insulating layer 111A disposed in the groove 130H or the penetrating portion 110H and the groove 130H may include only a resin excluding the reinforcing material such as an inorganic filler and glass fiber.

Next, the adhesive film 220 attached to one side of the first insulating layer 111A is peeled off. The peeling method is not particularly limited and may be carried out by a known method. For example, when the adhesive film 220 is a heat curable adhesive tape in which the adhesion is weakened by heat treatment, an ultraviolet curable adhesive tape in which the adhesion is weakened by ultraviolet irradiation, or the like, the peeling may be performed after weakening the adhesion by heat treating the adhesive film 220 or by irradiating UV light on the adhesive film 220.

As illustrated in FIG. 9C, a second insulating layer 141A and a third insulating layer 141B may be further laminated on the first insulating layer 111A and the core layer 130, respectively, as required.

On the other hand, if necessary according to product design or user requirements, a case in which a board having an electronic component embedded therein is formed by laminating different materials of a plurality of insulating layers and an adhesive layer to match a required substrate thickness, may be considered.

As such, in the case in which the laminated materials are different types of materials, it is difficult to interpret and predict thermal properties of a plurality of materials in combination, and it may thus be difficult to control warpage of the board. In addition, a pretreatment process of laminating lamination materials of a plurality of insulating layers and an adhesive layer may be required, and a processing time and costs may increase as the process becomes complicated.

On the other hand, in the case of going through the manufacturing process of the board having an electronic component embedded therein according to an example, only by adjusting the thickness of the core layer having a groove, the board having an electronic component embedded therein may have a thickness corresponding to the product design or user requirements. In addition, when the core layer and the insulating layer are formed of the same material, the thermal behavior and characteristics of a single material undergoing a thermal process may be predicted, and the possibility of the occurrence of warpage may be reduced, as compared to the case of using a composite material. In addition, the pretreatment process may be relatively simplified, thereby reducing process time and cost.

Although not illustrated in the drawings, a first wiring layer 141A, a second wiring layer 141B, a through-via 144, a first connection member 150, a second connection member 160 and the like may further be formed as necessary. The formation method thereof is not particularly limited and a well-known method may be used.

In addition, the manufacturing process of the board 100A having an electronic component embedded therein according to an example may be changed within a range that may be implemented by those skilled in the art. For example, the manufacturing order and/or manufacturing method of respective configurations may be changed and implemented.

Figure 10:
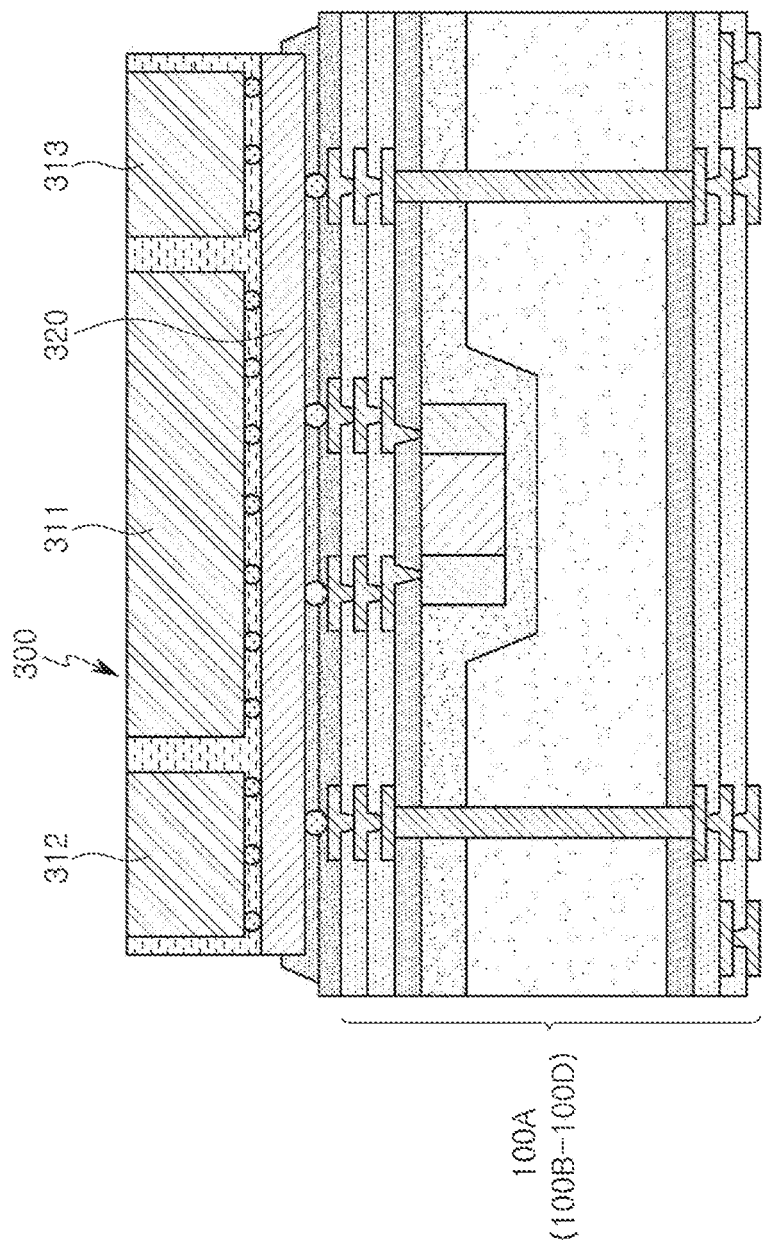
FIG. 10 is a schematic cross-sectional view schematically illustrating an example in which a semiconductor package is mounted on a board having an electronic component embedded therein according to an example.

FIG. 10 is a cross-sectional view schematically illustrating an example in which a semiconductor package is mounted on a board 100A having an electronic component embedded therein.

Referring to FIG. 10, in the case of using the above-described boards 100A, 100B, 100C or 100D having an electronic component embedded therein, according to an example of the present disclosure, a semiconductor package 300 in which first to third semiconductor chips 311, 312 and 313 are mounted on an interposer 320 to be electrically connected to each other, is mounted on the board 100A, 100B, 100C and 100D having an electronic component embedded therein, and an embedded electronic component 120 may be electrically connected to the first to third semiconductor chips 311, 312 and 313 of the semiconductor package 300 through a significantly short electrical path.

The first semiconductor chip 311 may be an application specific integrated circuit (ASIC), and the second and third semiconductor chips 312 and 313 may be high bandwidth memories (HBMs), but are not limited thereto.

As set forth above, according to an example, aboard having an electronic component embedded therein, in which the possibility of the occurrence of warpage may be reduced, is provided.

A board having an electronic component embedded therein, may be manufactured in a simplified process.

The meaning of being connected in the present disclosure encompasses not only a direct connection, but also includes an indirect connection. In addition, the term "electrically connected" means a concept including both a physical connection and non-connection. Further, the expressions, 'first', 'second' and the like are used to distinguish one component from another component and do not limit the order and/or importance of components and the like. In some cases, without departing from the scope of the rights, a first component may be referred to as a second component, and similarly, a second component may also be referred to as a first component.

The expression, an example, used in the present disclosure does not mean the same embodiment, but is provided for emphasizing and explaining different unique features. However, the above-mentioned examples or embodiments do not exclude being implemented in combination with the features of other examples. For example, although the description in the specific example is not described in another example, it may be understood as an explanation related to another example, unless otherwise described or contradicted by the other example.

The terms used in this inventive concept are only used to illustrate an example and are not intended to limit the present disclosure. The singular expressions include plural expressions unless the context clearly dictates otherwise.

What is claimed is:

1. A board having an electronic component embedded therein, the board comprising:
    a core layer having a groove with a bottom surface;
    the electronic component disposed above the bottom surface of the groove and spaced apart from the bottom surface of the groove; and
    a first insulating layer disposed on the core layer and covering at least a portion of the electronic component,
    wherein the first insulating layer is disposed in at least a portion of a space between the bottom surface of the groove and the electronic component, and
    wherein a material composition of the first insulating layer disposed in the at least a portion of a space between the bottom surface of the groove and the electronic component is different than a material composition of the first insulating layer covering at least a portion of a side surface of the electronic component.

2. The board of claim 1, wherein an upper surface of the electronic component opposing a bottom of the electronic component facing the bottom surface of the groove is exposed from one surface of the first insulating layer.

3. The board of claim 2, wherein the upper surface of the electronic component and the one surface of the first insulating layer are substantially coplanar with each other.

4. The board of claim 1, wherein an edge of the bottom surface of the groove has a rounded shape.

5. The board of claim 1, wherein a thickness of the core layer around the groove is greater than a thickness of the first insulating layer around the groove.

6. The board of claim 1, wherein the first insulating layer comprises a reinforcing material.

7. The board of claim 6, wherein the reinforcing material comprises an inorganic filler and a glass fiber.

8. The board of claim 6, wherein the reinforcing material is disposed between one surface of the first insulating layer in contact with the core layer around the groove, and the other surface of the first insulating layer opposite to the one surface of the first insulating layer.

9. The board of claim 6, wherein the reinforcing material of the first insulating layer is spaced apart from the groove.

10. The board of claim 6, wherein the first insulating layer and the core layer are composed of the same material.

11. The board of claim 1, wherein an interface between the core layer and the first insulating layer around the groove is located on a level between an upper surface and a lower surface of the electronic component.

12. The board of claim 1, further comprising a first connection member disposed on the first insulating layer and including a first redistribution layer connected to the electronic component.

13. The board of claim 12, further comprising a second connection member disposed on the core layer and including a second redistribution layer.

14. The board of claim 13, further comprising a first through-via penetrating through the core layer and the first insulating layer and connecting the first redistribution layer and the second redistribution layer to each other.

15. The board of claim 1, wherein an upper surface of the electronic component opposing a bottom of the electronic component facing the bottom surface of the groove protrudes from one surface of the first insulating layer.

16. The board of claim 15, further comprising:
    a second insulating layer disposed on the first insulating layer and covering at least a portion of the electronic component; and
    a third redistribution layer disposed on the second insulating layer and connected to the electronic component.

17. The board of claim 16, further comprising a connection member disposed on the core layer and including a fourth redistribution layer.

18. The board of claim 17, further comprising a second through-via penetrating through the core layer and connecting the third redistribution layer and the fourth redistribution layer to each other.

19. The board of claim 1, wherein a reinforcing material dispersed in the core layer is spaced apart from the electronic component, and a reinforcing material dispersed in the first insulating layer is spaced apart from the electronic component.

20. The board of claim 1, wherein a reinforcing material dispersed in the core layer is spaced apart from the electronic component, and a reinforcing material dispersed in the first insulating layer is in contact with the electronic component.

* * * * *